(12) United States Patent
Camarota

(10) Patent No.: US 9,547,034 B2
(45) Date of Patent: Jan. 17, 2017

(54) MONOLITHIC INTEGRATED CIRCUIT DIE HAVING MODULAR DIE REGIONS STITCHED TOGETHER

(71) Applicant: Xilinx, Inc., San Jose, CA (US)

(72) Inventor: Rafael C. Camarota, San Jose, CA (US)

(73) Assignee: XILINX, INC., San Jose, CA (US)

(*) Notice: Subject to any disclaimer, the term of this patent is extended or adjusted under 35 U.S.C. 154(b) by 416 days.

(21) Appl. No.: 13/935,066

(22) Filed: Jul. 3, 2013

(65) Prior Publication Data

US 2015/0008954 A1  Jan. 8, 2015

(51) Int. Cl.
*G01R 31/26* (2014.01)
*G01R 31/3185* (2006.01)
*G01R 31/317* (2006.01)
*H03K 19/177* (2006.01)

(52) U.S. Cl.
CPC ......... *G01R 31/26* (2013.01); *G01R 31/31721* (2013.01); *G01R 31/31723* (2013.01); *G01R 31/318505* (2013.01); *G01R 31/318516* (2013.01); *H03K 19/1774* (2013.01); *H03K 19/17728* (2013.01); *H03K 19/17772* (2013.01); *H03K 19/17788* (2013.01)

(58) Field of Classification Search
None
See application file for complete search history.

(56) References Cited

U.S. PATENT DOCUMENTS

| | | | |
|---|---|---|---|
| 4,467,342 A | 8/1984 | Tower | |
| 4,803,595 A | 2/1989 | Kraus et al. | |
| 5,285,236 A | 2/1994 | Jain | |
| 5,399,898 A | 3/1995 | Rostoker | |
| 5,437,946 A | 8/1995 | McCoy | |
| 5,489,804 A | 2/1996 | Pasch | |
| 5,652,163 A * | 7/1997 | Schinella | G03F 7/70433 438/599 |
| 5,673,276 A | 9/1997 | Jarwala et al. | |
| 5,687,179 A | 11/1997 | Whetsel et al. | |
| 5,715,144 A | 2/1998 | Ameen et al. | |
| 5,787,007 A | 7/1998 | Bauer | |
| 5,814,847 A | 9/1998 | Shihadeh et al. | |
| 5,869,894 A | 2/1999 | Degani et al. | |
| 5,897,986 A | 4/1999 | Dunn et al. | |
| 5,907,903 A | 6/1999 | Ameen et al. | |
| 6,043,672 A | 3/2000 | Sugasawara | |

(Continued)

FOREIGN PATENT DOCUMENTS

EP  2151717 A1  2/2010

OTHER PUBLICATIONS

U.S. Appl. No. 13/369,215, filed Feb. 8, 2012, Banijamali.

(Continued)

*Primary Examiner* — Paresh Patel
(74) *Attorney, Agent, or Firm* — W. Eric Webostad; Steven Roberts

(57) ABSTRACT

An apparatus for a monolithic integrated circuit die is disclosed. In this apparatus, the monolithic integrated circuit die has a plurality of modular die regions. The modular die regions respectively have a plurality of power distribution networks for independently powering each of the modular die regions. Each adjacent pair of the modular die regions is stitched together with a respective plurality of metal lines.

15 Claims, 8 Drawing Sheets

(56) References Cited

U.S. PATENT DOCUMENTS

| | | | |
|---|---|---|---|
| 6,085,344 A | 7/2000 | Whetsel et al. |
| 6,157,213 A | 12/2000 | Voogel |
| 6,158,035 A | 12/2000 | Whetsel et al. |
| 6,160,418 A | 12/2000 | Burnham |
| 6,204,689 B1 | 3/2001 | Percey et al. |
| 6,215,327 B1 | 4/2001 | Lyke |
| 6,216,257 B1 | 4/2001 | Agrawal et al. |
| 6,218,864 B1 | 4/2001 | Young et al. |
| 6,239,366 B1 | 5/2001 | Hsuan et al. |
| 6,288,772 B1 | 9/2001 | Shinozaki et al. |
| 6,359,466 B1 | 3/2002 | Sharpe-Geisler |
| 6,369,444 B1 | 4/2002 | Degani et al. |
| 6,396,303 B1 | 5/2002 | Young |
| 6,407,456 B1 | 6/2002 | Ball |
| 6,410,983 B1 | 6/2002 | Moriizumi et al. |
| 6,429,509 B1 | 8/2002 | Hsuan |
| 6,448,808 B2 | 9/2002 | Young et al. |
| 6,500,696 B2 | 12/2002 | Sutherland |
| 6,512,573 B2 | 1/2003 | Fürter |
| 6,525,407 B1 | 2/2003 | Drewery |
| 6,559,531 B1 | 5/2003 | Sutherland |
| 6,583,854 B1 | 6/2003 | Hazama et al. |
| 6,611,635 B1 | 8/2003 | Yoshimura et al. |
| 6,675,333 B1 | 1/2004 | Whetsel et al. |
| 6,731,009 B1 | 5/2004 | Jones et al. |
| 6,734,553 B2 | 5/2004 | Kimura |
| 6,870,271 B2 | 3/2005 | Sutherland et al. |
| 6,930,378 B1 | 8/2005 | St. Amand et al. |
| 6,944,809 B2 | 9/2005 | Lai et al. |
| 6,972,487 B2 | 12/2005 | Kato et al. |
| 6,984,889 B2 | 1/2006 | Kimura |
| 6,988,230 B2 | 1/2006 | Vermeulen et al. |
| 6,992,395 B2 | 1/2006 | Fukasawa |
| 7,002,828 B2 | 2/2006 | Santin et al. |
| 7,028,281 B1 | 4/2006 | Agrawal et al. |
| 7,030,466 B1 | 4/2006 | Hsuan |
| 7,069,485 B2 | 6/2006 | Whetsel et al. |
| 7,071,568 B1 | 7/2006 | St. Amand et al. |
| 7,087,989 B2 | 8/2006 | Nakayama |
| 7,088,134 B1 | 8/2006 | Agrawal et al. |
| 7,095,253 B1 | 8/2006 | Young |
| 7,098,542 B1 | 8/2006 | Hoang et al. |
| 7,107,565 B1 | 9/2006 | Lindholm et al. |
| 7,132,753 B1 | 11/2006 | St. Amand et al. |
| 7,154,297 B1 * | 12/2006 | Camarota ......... H03K 19/1776 326/38 |
| 7,181,718 B1 | 2/2007 | Bilski et al. |
| 7,187,200 B2 | 3/2007 | Young |
| 7,190,190 B1 | 3/2007 | Camarota et al. |
| 7,193,433 B1 | 3/2007 | Young |
| 7,196,543 B1 | 3/2007 | Young et al. |
| 7,199,610 B1 | 4/2007 | Young et al. |
| 7,202,697 B1 | 4/2007 | Kondapalli et al. |
| 7,202,698 B1 | 4/2007 | Bauer et al. |
| 7,205,790 B1 | 4/2007 | Young |
| 7,215,016 B2 | 5/2007 | Wang |
| 7,215,138 B1 | 5/2007 | Kondapalli et al. |
| 7,218,139 B1 | 5/2007 | Young et al. |
| 7,218,140 B1 | 5/2007 | Young |
| 7,218,143 B1 | 5/2007 | Young |
| 7,221,186 B1 | 5/2007 | Young |
| 7,230,329 B2 | 6/2007 | Sawamoto et al. |
| 7,233,168 B1 | 6/2007 | Simkins |
| 7,253,658 B1 | 8/2007 | Young |
| 7,256,612 B1 | 8/2007 | Young et al. |
| 7,265,576 B1 | 9/2007 | Kondapalli et al. |
| 7,268,587 B1 | 9/2007 | Pham et al. |
| 7,274,214 B1 | 9/2007 | Young |
| 7,276,934 B1 | 10/2007 | Young |
| 7,279,929 B1 | 10/2007 | Young |
| 7,284,226 B1 | 10/2007 | Kondapalli |
| 7,301,824 B1 | 11/2007 | New |
| 7,314,174 B1 | 1/2008 | Vadi et al. |
| 7,337,422 B1 | 2/2008 | Becker et al. |
| 7,345,507 B1 | 3/2008 | Young et al. |
| 7,402,443 B1 | 7/2008 | Pang et al. |
| 7,402,901 B2 | 7/2008 | Hatano et al. |
| 7,425,760 B1 | 9/2008 | Guenin et al. |
| 7,436,061 B2 | 10/2008 | Nakayama |
| 7,451,421 B1 | 11/2008 | Bauer et al. |
| 7,459,776 B1 | 12/2008 | St. Amand et al. |
| 7,491,576 B1 | 2/2009 | Young et al. |
| 7,498,192 B1 | 3/2009 | Goetting et al. |
| 7,859,119 B1 | 12/2010 | St. Amand et al. |
| 7,872,495 B1 * | 1/2011 | Tran ................ H03K 19/01837 326/30 |
| 7,906,852 B2 | 3/2011 | Nishimura et al. |
| 7,999,383 B2 | 8/2011 | Hollis |
| 8,001,511 B1 | 8/2011 | Bauer et al. |
| 8,018,250 B1 * | 9/2011 | Klein .................. H03K 19/177 326/30 |
| 8,062,968 B1 | 11/2011 | Conn |
| 8,072,057 B2 | 12/2011 | Matsumura |
| 8,080,874 B1 | 12/2011 | Werner et al. |
| 8,097,957 B2 | 1/2012 | Chen et al. |
| 8,163,600 B2 | 4/2012 | Chow et al. |
| 8,217,682 B1 * | 7/2012 | Starr ................ H03K 19/01852 326/83 |
| 8,227,904 B2 | 7/2012 | Braunisch et al. |
| 8,237,289 B2 | 8/2012 | Urakawa |
| 8,274,794 B2 | 9/2012 | Huang et al. |
| 8,294,490 B1 | 10/2012 | Kaviani |
| 8,295,056 B2 | 10/2012 | Andry et al. |
| 8,327,201 B1 | 12/2012 | Lai |
| 8,338,963 B2 | 12/2012 | Haba et al. |
| 8,344,519 B2 | 1/2013 | Lu et al. |
| 8,384,411 B2 | 2/2013 | Mooyman-Beck et al. |
| 8,415,783 B1 | 4/2013 | Rahman et al. |
| 8,546,955 B1 | 10/2013 | Wu |
| 8,615,694 B2 | 12/2013 | Whetsel |
| 8,704,364 B2 | 4/2014 | Banijamali |
| 8,704,384 B2 | 4/2014 | Wu et al. |
| 8,810,006 B2 | 8/2014 | Yu et al. |
| 8,928,132 B2 | 1/2015 | Choi et al. |
| 8,946,868 B2 * | 2/2015 | Leung ................ H01L 23/4952 257/620 |
| 2002/0024146 A1 | 2/2002 | Furusawa |
| 2002/0175421 A1 | 11/2002 | Kimura |
| 2003/0079166 A1 | 4/2003 | Vermeulen et al. |
| 2003/0183917 A1 | 10/2003 | Tsai et al. |
| 2004/0093534 A1 | 5/2004 | Whetsel et al. |
| 2004/0184250 A1 | 9/2004 | Wang |
| 2004/0195668 A1 | 10/2004 | Sawamoto |
| 2004/0195682 A1 | 10/2004 | Kimura |
| 2004/0227223 A1 | 11/2004 | Sawamoto |
| 2005/0112614 A1 | 5/2005 | Cook et al. |
| 2005/0166106 A1 | 7/2005 | Warren |
| 2005/0216802 A1 | 9/2005 | Warren |
| 2006/0001163 A1 | 1/2006 | Kolbehdari et al. |
| 2006/0017147 A1 | 1/2006 | Drost et al. |
| 2006/0099736 A1 | 5/2006 | Nagar et al. |
| 2006/0119384 A1 * | 6/2006 | Camarota ........... G06F 15/7867 326/38 |
| 2006/0157866 A1 | 7/2006 | Le et al. |
| 2006/0220227 A1 | 10/2006 | Marro |
| 2006/0226527 A1 | 10/2006 | Hatano et al. |
| 2006/0226529 A1 | 10/2006 | Kato et al. |
| 2007/0023921 A1 | 2/2007 | Zingher et al. |
| 2007/0029646 A1 | 2/2007 | Voldman |
| 2007/0101217 A1 | 5/2007 | Whetsel et al. |
| 2007/0204252 A1 | 8/2007 | Furnish et al. |
| 2007/0210428 A1 | 9/2007 | Tan et al. |
| 2007/0231966 A1 | 10/2007 | Egawa |
| 2007/0278642 A1 | 12/2007 | Yamaguchi et al. |
| 2008/0179735 A1 | 7/2008 | Urakawa |
| 2009/0057919 A1 | 3/2009 | Lin et al. |
| 2009/0267238 A1 | 10/2009 | Joseph et al. |
| 2010/0330741 A1 | 12/2010 | Huang et al. |
| 2011/0019368 A1 | 1/2011 | Andry et al. |
| 2011/0148456 A1 | 6/2011 | Mooyman-Beck et al. |
| 2011/0169171 A1 | 7/2011 | Marcoux |
| 2011/0180317 A1 | 7/2011 | Takahashi et al. |
| 2011/0254162 A1 | 10/2011 | Hollis |
| 2011/0316572 A1 | 12/2011 | Rahman |

(56) References Cited

U.S. PATENT DOCUMENTS

| | | |
|---|---|---|
| 2012/0019292 A1 | 1/2012 | Lu et al. |
| 2012/0020027 A1 | 1/2012 | Dungan et al. |
| 2012/0032342 A1 | 2/2012 | Min et al. |
| 2012/0124257 A1 | 5/2012 | Wu |
| 2012/0204073 A1 | 8/2012 | Whetsel |
| 2012/0206889 A1 | 8/2012 | Norman |
| 2012/0249179 A1 | 10/2012 | Price et al. |
| 2012/0301977 A1 | 11/2012 | Andry et al. |
| 2012/0319248 A1 | 12/2012 | Rahman |
| 2012/0324305 A1 | 12/2012 | Whetsel |
| 2012/0331435 A1 | 12/2012 | Rahman |
| 2013/0020675 A1 | 1/2013 | Kireev et al. |
| 2013/0022136 A1 | 1/2013 | Collins |
| 2013/0093074 A1 | 4/2013 | Grant |
| 2013/0134553 A1 | 5/2013 | Kuo et al. |
| 2013/0181360 A1 | 7/2013 | Kim et al. |
| 2013/0200511 A1 | 8/2013 | Banijamali |
| 2013/0214432 A1 | 8/2013 | Wu et al. |
| 2013/0252378 A1 | 9/2013 | Jeng et al. |
| 2013/0333921 A1 | 12/2013 | Hisamura |
| 2014/0013174 A1 | 1/2014 | Whetsel |
| 2014/0049932 A1* | 2/2014 | Camarota ............ H01L 23/145 361/807 |
| 2014/0070423 A1 | 3/2014 | Woychik et al. |
| 2014/0077391 A1 | 3/2014 | Kikuchi et al. |
| 2014/0084459 A1 | 3/2014 | Yue et al. |

OTHER PUBLICATIONS

U.S. Appl. No. 13/399,939, filed Feb. 17, 2012, Wu et al.
U.S. Appl. No. 13/587,778, filed Aug. 16, 2012, Camarota.
U.S. Appl. No. 13/527,453, filed Jun. 19, 2012, Hisamura.
U.S. Appl. No. 13/535,102, filed Jun. 27, 2012, Camarota.
Specification and drawings for U.S. Appl. No. 14/321,591, filed Jul. 1, 2014, Hisamura.
Chi, Chun-Chuan et al., "Post-Bond Testing of 2.5D-SICs and 3D-SICs Containing a Passive Silicon Interposer Base," *Proc. of the 2011 IEEE International Test Conference*, Sep. 20, 2011, pp. 1-10, IEEE, Piscataway, New Jersey, USA.

\* cited by examiner

MONOLITHIC INTEGRATED CIRCUIT DIE HAVING MODULAR DIE REGIONS STITCHED TOGETHER

TECHNICAL FIELD

The following description relates to integrated circuit devices ("ICs"). More particularly, the following description relates to a monolithic integrated circuit die having modular die regions stitched together for an IC.

BACKGROUND

Integrated circuits have become more "dense" over time, i.e., more logic features have been implemented in an IC of a given size. Therefore, power consumption has become an increasingly more significant issue, including power consumption during wafer-level testing. Hence, it is desirable to provide an IC having power consumption more suitable for wafer-level testing.

SUMMARY

An apparatus relates generally to a monolithic integrated circuit die. In such an apparatus, the monolithic integrated circuit die has a plurality of modular die regions. The modular die regions respectively have a plurality of power distribution networks for independently powering each of the modular die regions. Each adjacent pair of the modular die regions is stitched together with a respective plurality of metal lines.

A method relates generally to a monolithic integrated circuit die. In such a method, an obtained monolithic integrated circuit die has a first die region and a second die region. The first die region has a first power distribution network, and the second die region has a second power distribution network. The first power distribution network is separate from the second power distribution network for operation of the first die region independently from the second die region. The first die region and the second die region are interconnected to one another through a first plurality of metal lines and a second plurality of metal lines. The first plurality of metal lines and the second plurality of metal lines are coupled to a first plurality of select circuits and a second plurality of select circuits. The first die region is powered up with the first power distribution network while leaving the second power distribution network of the second die region powered down. The first die region is put in a loopback mode. The first die region is tested while in the loopback mode.

Another apparatus relates generally to a monolithic integrated circuit die. In such an apparatus, the monolithic integrated circuit die has a first die region and a second die region. The first die region has a first power distribution network, and the second die region has a second power distribution network. The first power distribution network is separate from the second power distribution network for operation of the first die region independently from the second die region. The first die region and the second die region are interconnected to one another through a first plurality of metal lines and a second plurality of metal lines. The first plurality of metal lines and the second plurality of metal lines are coupled to a first plurality of select circuits and a second plurality of select circuits. The first die region has a defective portion. The second die region is used to provide the monolithic integrated circuit die as a functional die with the defective portion isolated from the second die region.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

DETAILED DESCRIPTION

Figure 1:
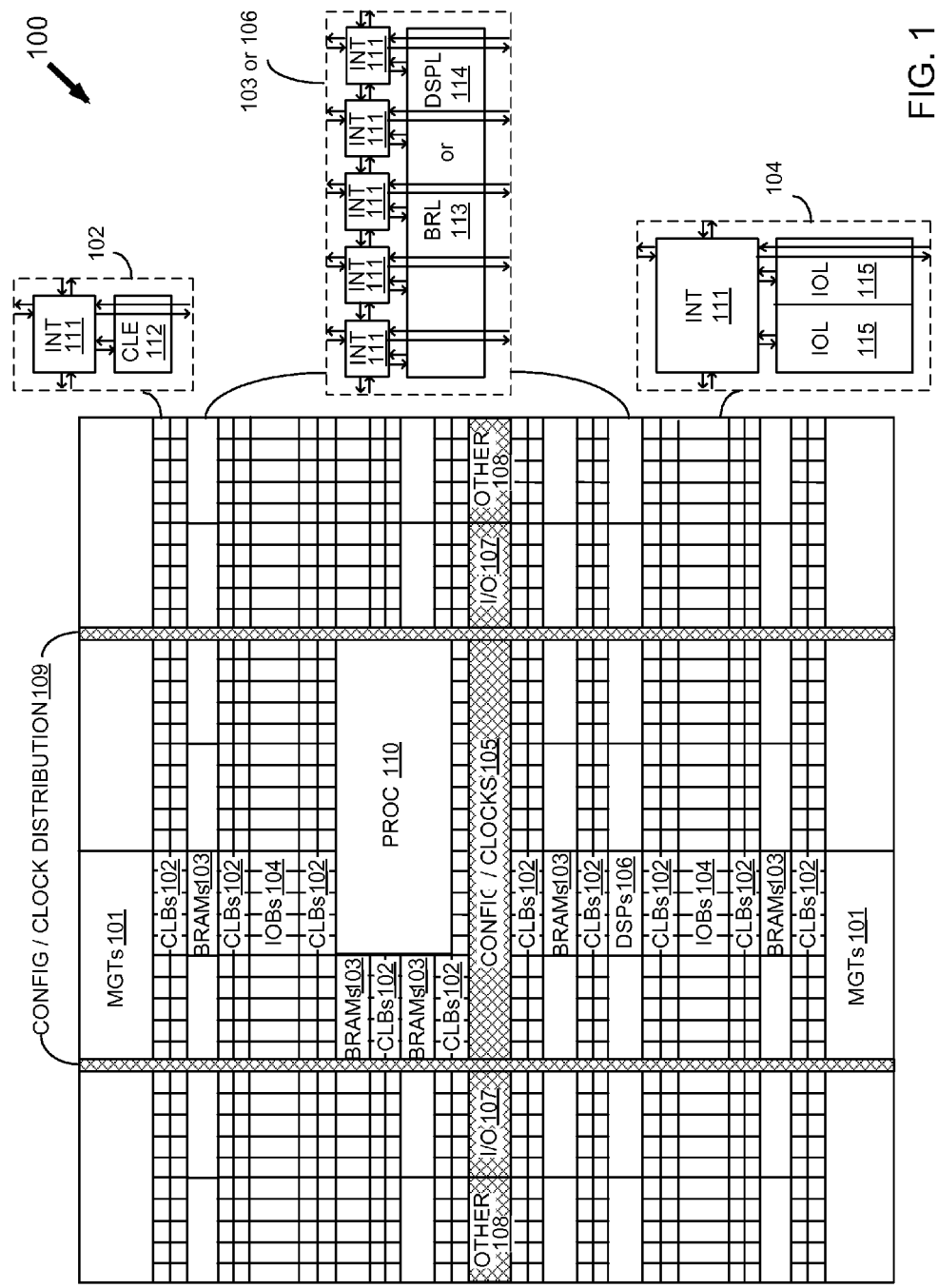
FIG. 1 is a simplified block diagram depicting an exemplary columnar Field Programmable Gate Array ("FPGA") architecture.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided to further understanding.

Formation of monolithic integrated circuit die may be limited by a maximum field size of a lithography used. Furthermore, even if a monolithic integrated circuit die is formed which exceeds such a maximum field size, it may consume too much power to be tested at a wafer level. However, a monolithic integrated circuit die may have performance advantages over a functionally equivalent stacked die or stacked interposer die.

With the above general understanding borne in mind, various configurations for a monolithic integrated circuit die having modular die regions are generally described below. Such monolithic integrated circuit die has separately powered modular die regions, which may be isolated from one another. Furthermore, a monolithic integrated circuit die may be operated in a loopback mode or a interconnected die region mode ("stitch mode").

Because one or more of the above-described examples are described herein using a particular type of IC, a detailed description of such an IC is provided below. However, it should be understood that other types of ICs may benefit from one or more of the techniques described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An 10B 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Masks may be lithographically "stitched" together to make a large die, such as described for stacked-silicon interposer technology. However, such lithographic stitching may likewise be used to form a monolithic integrated circuit die, as described below in additional detail. Along those lines, the number of ultra-high resolution masks used to make a "supersized" monolithic integrated circuit die may be limited by having stitching performed at the highest metal layers. Furthermore, as described below in additional detail, the number of layers used to "stitch" across a mask-field boundary may be substantially reduced by reusing regions of self-contained circuitry ("modular"), which may be separated by scribe line for at least one or more of the initial semiconductor process layers.

Even though the following description is for formation of a monolithic integrated circuit die having two die regions, this description should not be limited to having only two die regions. Rather, two or more die regions may be stitched together to form a single monolithic integrated circuit die. Furthermore, the following description is in terms of an FPGA being such monolithic integrated circuit die for purposes of clarity by way of example and not limitation; however, any type of large integrated circuit die may benefit from having modular die regions as described herein. Along those lines, the following description should not be limited to FPGAs, but includes any integrated circuit of suitable size for having modular die regions.

Heretofore, a stitched die may have had two complete mask sets for each layer, for example, where there is a top half and a bottom half of a final die. The top and bottom halves, may be similar, but are different halves of the final die product. For example for a 20 nanometer ("nm") process, this may involve a substantial number of ultra-high resolution double patterning masks. However, as described below in additional detail substantially fewer mask, as well as substantially fewer ultra-high resolution double pattern masks, may be used to form a monolithic integrated circuit die. Furthermore, fewer of such masks may be stitched together to form such monolithic integrated circuit die.

Another benefit of a modular monolithic die, namely where a larger die is made up of substantially similar and/or identical smaller dies, is a reduction in verification overhead. Verification is a time and resource intensive engineering task. Being able to divide verification into a problem which is a fraction of the size of an overall die, such as one-half or one-third the size for example, can have substantial value in accelerated time to market and reduced cost of engineering infrastructure. Yet another benefit of a modular monolithic die is a reduction in database management. As technology advances, dies are getting larger, and larger and larger dies put increasing strain on the manufacturing process. The transmitting of data from designer to mask-shop or the flattening of data of a large device for any function may not be possible by all software tools, as such data may be in excess of a terabyte. A modular designed monolithic die substantially reduces the data used to manufacture, transmit, and/or simulate a large monolithic device formed of two or more modules, as identical data sets for identical modules means that only one of such data sets may be sent representing all of such data sets.

Figure 2:
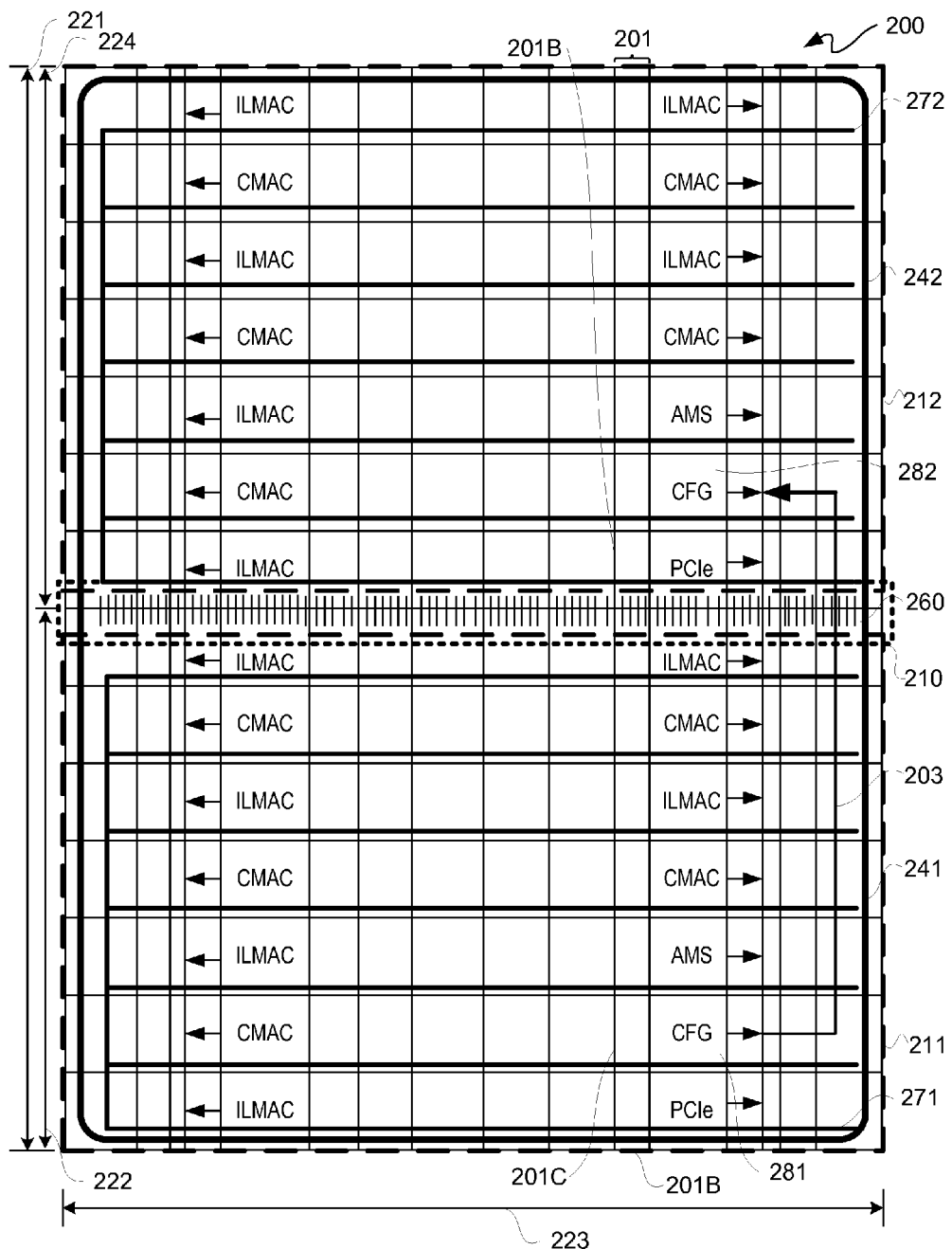
FIG. 2 is a block diagram of a top view depicting an exemplary monolithic integrated circuit die ("die") having die regions.

FIG. 2 is a block diagram of a top view depicting an exemplary monolithic integrated circuit die ("die") 200 having a die region 211 and a die region 212. Die regions 211 and 212 may each have a same width 223. Die region 211 may have a length 222, and die region 212 may have a same or different length, namely length 224, than length 222 of die region 212. Die 200 may have an overall length 221, which is a sum or a combination of lengths 222 and 224 respectively of die regions 211 and 212. In this example, width 223 is approximately 30 millimeters ("mm") and overall length 221 is 31 mm, where lengths 222 and 224 are each 15.5 mm; however, these and/or other lengths and/or widths may be used. More generally, each die region 211 and 212 may be within width and length maximum limitations of lithography; however, overall length 221 of die 200 may exceed a maximum limitation of such lithography. For example, presently a maximum limitation of lithography may be 26 mm or 33 mm, where heretofore a monolithic die conventionally did not have one or more dimensions greater than 26 mm and did not have any dimension greater than 33 mm. However, as described below, a modular monolithic integrated circuit die formed of a die modules may exceed such present day maximums.

Even though lengths 222 and 224 are illustratively depicted as being equal, they need not be. For example, an asymmetric rather than a symmetric division may be used. Along those lines, length 222 may be close to 26 mm, and length 221 may be substantially shorter than 26 mm, where die region 212 is used to provide redundancy for die region 211.

In this example, die regions 211 and 212 may have equivalent functionality, as described below in additional detail. For purposes of clarity by way of example and not limitation, both die regions 211 and 212 are illustratively depicted with same blocks, including without limitation CFG and PCIe blocks, as well as each having a column of I/O blocks ("I/Os") 201; however, in other configurations these or other blocks may be used. I/Os 201 may include gigabit transceivers ("GTs"). This allows mask sets for forming die regions 211 and 212 to be substantially the same, except for one or more upper metal layers, as described below in additional detail. Additionally, die region 211 may be formed with a wall 241 as a part of a die seal, generally indicated as an upward facing "U", and die region 212 may be formed with another part of a wall 242 of a die seal, generally indicated as a downward facing "U". In other words, a die seal of a monolithic integrated circuit die may include a first wall formed in one die region and a second wall formed in an adjacent second die region, where the first wall and the second wall face one another and are connected to one another to provide the die seal of such monolithic integrated circuit die. By having such walls 241 and 242 face one another from or on opposite adjacent die regions of die 200, wall ends of such walls 241 and 242 may respectively contact one another to form a perimeter wall or a die seal of die 200.

Each die region 211 and 212 may have a column of I/Os 201. Some of I/Os 201 may be specialized. For example, I/Os 201B may be long range I/Os of I/Os 201 operating with a larger voltage swing than others of such I/Os 201, and such other I/Os may be high-speed I/Os operating with a smaller voltage swing. Furthermore, I/O 201C may be a configuration I/O, where configuration I/O 201C of die region 211 may be a master block for controlling and/or configuring a slave I/O block 201 of die region 212, as generally indicated by line 203.

Line 203 interconnects configuration ("CFG") blocks 281 and 282 respectively of die regions 211 and 212. Line 203 represents a master-to-slave configuration bus. This bus in the past was implemented on an interposer connecting two dies. In die 200, such interconnection of two independent configurations blocks of separate die regions 211 and 212 is done using a layer that is stitched across a mask field boundary, namely mask stitching region 210. These interconnections may also include JTAG interconnections. Along those lines, JTAG blocks of each die region 211 and 212 may be interconnected within die 200. By having independent JTAG blocks, die regions 211 and 212 may be separately tested at wafer sort, where only a die region currently being tested is powered up. Thus, if one die region is bad and another die region is good, die 200 may be sold, though with less functionality than if all die regions were good. Thus, a partially functional die 200 may be sold. Furthermore, if both or all die regions had to be powered, namely had a common powering-up configuration, and/or had only one JTAG block for testing all die regions, it may not be possible to use only good die regions of a partially functional die 200. However, as only those die regions passing testing may be used, JTAG blocks in failing die regions need not be used in a packaged part. Moreover, failing die regions in a packaged part need not be powered up.

Die region 211 and die region 212 may be coupled to one another via mask stitching region 210. Along those lines, conductors 260 may cross a border between die regions 211 and 212, as described below in additional detail. At a wafer level, mask stitching region 210 may be in a location formerly used for scribe lines on a wafer. Furthermore, even though it is assumed that there is one mask set for forming die region 211 and a portion of mask stitching region 210 and another mask set for forming die region 212 and another portion of mask stitching region 210, in another configuration mask stitching region 210 may be formed with its own mask set. However, for purposes of clarity and not limitation, it shall be assumed that each of the mask sets used to form die regions 211 and 212 has an extra mask field portion for a respective portion of mask stitching region 210.

Die region 211 has a power distribution network ("PDN"), generally PDN 271, and die region 212 has a PDN, generally PDN 272. PDNs 271 and 272 are separate from one another. Along those lines, PDN 271 may be separately or independently operated from PDN 272. Thus, die region 211 may be separately powered from die region 212. Accordingly, die region 211 may be powered-up and operated while die region 212 is powered-off, and vice versa. Having separately powered die regions or die modules allows a monolithic die to be formed having multiple die modules, where the entirety of such monolithic die need not be tested at one time. Rather, each die module may be separately powered up and tested. Additionally, as previously indicated, there are other benefits, such as reduced time to market, reduced engineering overhead, and/or reduced data size for example, to having die modules used to form a monolithic integrated circuit die.

Figure 3:
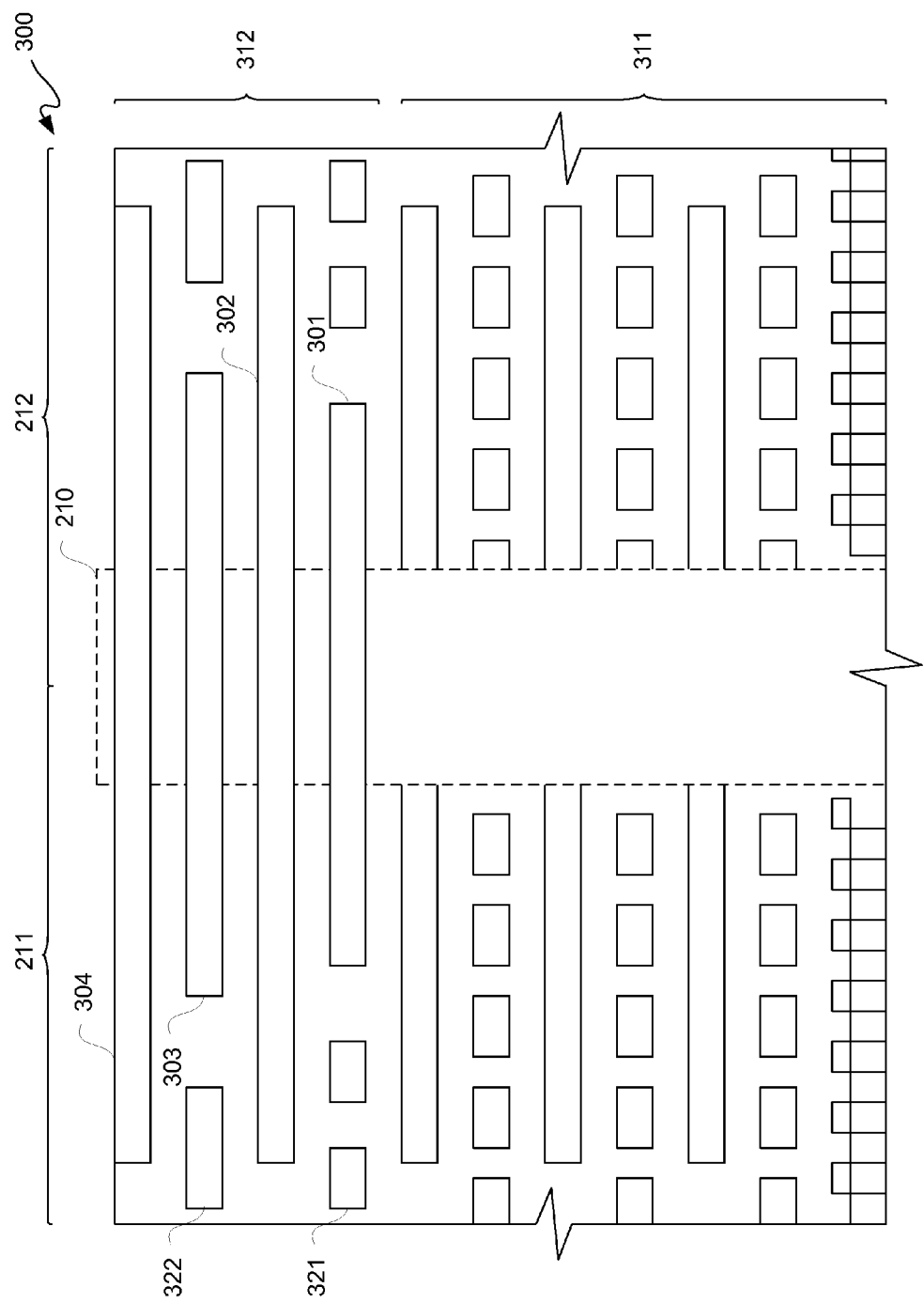
FIG. 3 is a block diagram of a cross-sectional view depicting an exemplary portion of a monolithic integrated circuit die ("die"), which may be the die of FIG. 2.

FIG. 3 is a block diagram of a cross-sectional view depicting an exemplary portion of a monolithic integrated circuit die ("die") 300, which may be die 200 of FIG. 2. Accordingly, with simultaneous reference to FIGS. 2 and 3, die 300 is further described.

In this example, die region 211 and die region 212 are each formed with a same set of initial or lower layers 311, and thus a same set of mask sets may be used for such initial layers. Upper conductive or metal layers 312, where lithographic limitations may be substantially relaxed as compared with lower layers 311, may be used to provide one or more stitching lines, such as stitching lines 301 through 304 for example. In this example, stitching lines or traces 301 through 304 may represent vertically routed traces or vertical routing. Lower layers 311 may not have features that extend across mask stitching region 210 for interconnecting die regions 211 and 212; however, upper layers 312 may have stitching lines, such as stitching lines 301 through 304 for example, that extend across mask stitching region 210 for interconnection of die regions 211 and 212, as described below in additional detail.

Stitching line 301 extends horizontally across mask stitching region 210 from or to die region 211 to or from die region 212. In contrast, conductive lines 321 of a same metal layer as stitching line 301 extend out of the page or orthogonally with respect to a plane of the page. Likewise, conductive lines 322 of a same metal layer as stitching line 303 extend out of the page. Conductive lines or traces 321 and 322 in this example may represent horizontally routed traces or horizontal routing. Having a large number of horizontal lines extending from one die region to another die region may be used to increase bandwidth for communication between such die regions. Stitching lines 301 through 304 conventionally are "double pitch" lines, namely each stitching line may be twice as wide as a comparably positioned signal line of a same metal layer, and spacing between adjacent stitching lines of a same metal layer may be twice as large as a comparably positioned signal line of such same metal layer. Moreover, all stitching lines, such as stitching lines 301 through 304 for example, may not have contending orthogonal lines within their associated metal layers, which allows for more double pitch lines to be used by having them in more than one metal layer of metal layers 312. By not having perpendicular lines, more sets of parallel stitching lines may be formed to increase bandwidth. In this embodiment, stitching region 210 may have only horizontal lines running through it. Orthogonal lines, like lines 322 and 321 for example, are not allowed in stitching region 210. Lines 302 and 304 can only carry approximately half the bandwidth through region 210 since they are at approximately twice the pitch ("double pitch") of lines not in stitching region 210. By using orthogonal lines in layers associated with lines 301 and 303 to supplement bandwidth of lines 302 and 304, bandwidth across stitching region 210 can be increased to that of regions outside of stitching region 210 with respect to other lines for example in layers having lines 302 and 304.

Current process rules allow metal traces to be stitched across a mask field boundary with twice the minimum width and twice the minimum space to bridge such mask field boundary. Alternating metal layers may respectively be vertically and horizontally routed. Thus, for example, if vertical long-line traces use four metal layers, such metal layers may be spaced across eight layers with horizontal layers between each of such vertical layers. Thus, horizontal traces need not be located in mask stitching region 210, and any metal layer may be used for vertically routed traces.

Lower layers 311, including without limitation lower metal layers, that are formed using double patterning need not use stitching. This may reduce mask costs for such masks. Furthermore, as described below in additional detail, a mask stitching region 210 may be located in what once was a scribe region. Along those lines, as such scribe region previously did not have any intervening device circuit structures, there may be a significant amount of semiconductor area in which to stitch. Furthermore, even though additional masks may be used to account for differences in modules with respect to stitching layers, uses of a common database for each of such modules may reduce development, verification, and/or test time, as well as reducing database size, in comparison to having one large database covering all circuitry of a large monolithic die.

Figure 4:
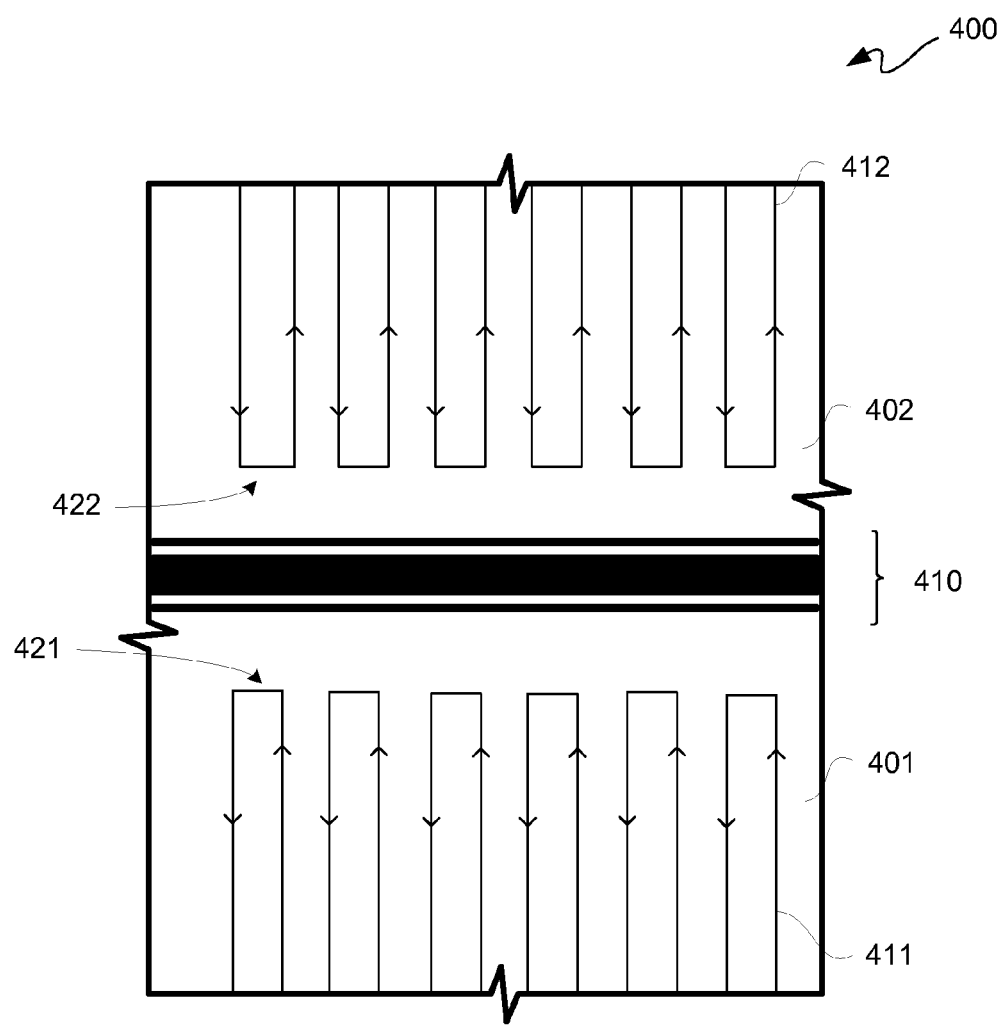
FIG. 4 is a block diagram from a top view depicting an exemplary portion of a prior wafer having multiple die regions.

FIG. 4 is a block diagram from a top view depicting an exemplary portion of a prior wafer 400 having multiple die regions. In this example, a die region 401 is separated from a die region 402 by scribe lines of a scribe region 410. Separate dies respectively associated with separate die regions 401 and 402 may be diced or otherwise severed from wafer 400 along scribe lines of scribe regions 410.

Interconnect lines 411 of die region 401 each have a loopback 421. Likewise, interconnect lines 412 of die region 402 each have a loopback 422. Interconnect lines 411 and 412 may be what are known as "interconnect long lines."

Figure 5:
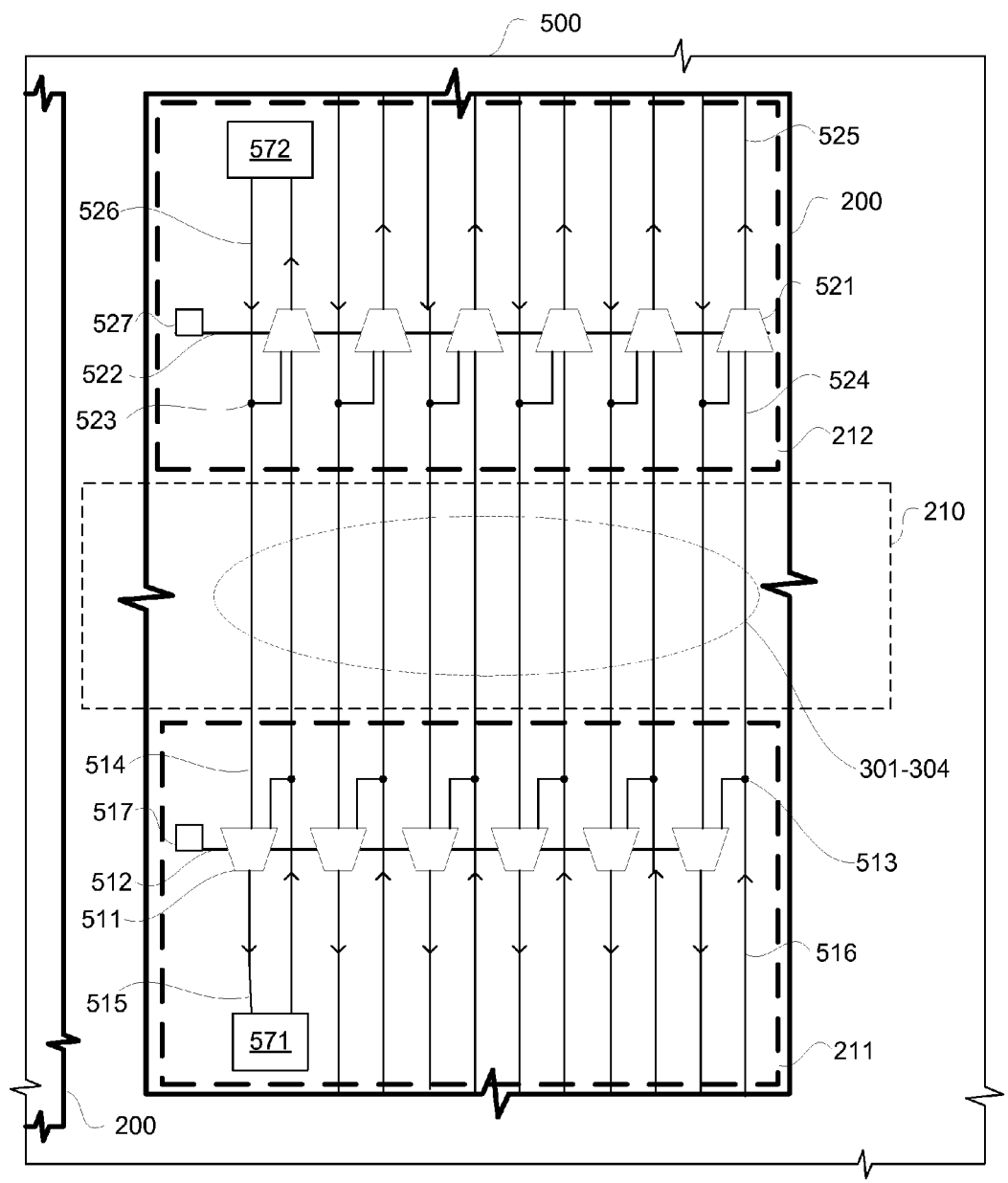
FIG. 5 is a block diagram from a top view depicting an exemplary portion of a wafer having multiple die regions, such as die regions of FIG. 2 for example.

FIG. 5 is a block diagram from a top view depicting an exemplary portion of a wafer 500 having multiple die regions, such as die regions 211 and 212 for example. Wafer 500 may include one or more dies 200.

Die region 211 includes a set of select circuits, such as multiplexers 511 for example, and die region 212 includes a set of select circuits, such as multiplexers 521 for example. As previously described, die regions 211 and 212 may be separately powered, and thus either set of multiplexers may be on while the other set of such multiplexers is off. Furthermore, both sets of multiplexers may be on or off.

Output conductive lines ("output lines") 515 of multiplexers 511 may extend from output ports of multiplexers 511 into die region 211, and such output lines 515 may be interconnect long lines. Likewise, output lines 525 of multiplexers 521 may extend into die region 212, and such output lines 525 may be interconnect long lines, with a couple of respective pairs of input/output lines provided to controller blocks, as described below in additional detail.

Input conductive lines ("input lines") 516 of die region 211 may extend into mask stitching region 210 for interconnection with input lines 524 of die region 212. Likewise, input lines 526 of die region 212 may extend into mask stitching region 210 for interconnection with input lines 514 of die region 211. Thus, input lines 514, 516, 524, and 526 may be one or more stitching lines, such as stitching lines 301 through 304 of FIG. 3 for example.

Input lines 516 may be respectively tapped at nodes 513 for providing data inputs to multiplexers 511. Other data inputs to multiplexers 511 may be respectively provided from input lines 514. Outputs of multiplexers 511 may be controllably selected responsive to select signal 512, which may be provided to each of multiplexers 511. Select signal 512 may be sourced from a programmable termination block 517 of die region 211.

Likewise, input lines 526 may be respectively tapped at nodes 523 for providing data inputs to multiplexers 521. Other data inputs to multiplexers 521 may be respectively provided from input lines 524. Outputs of multiplexers 521 may be controllably selected responsive to select signal 522, which may be provided to each of multiplexers 521. Select signal 522 may be sourced from a programmable termination block 527 of die region 212.

Thus, effectively, there is a set or portion of stitching lines that extend from die region 211 to a set of input ports of select circuits of die region 212, which stitching lines may effectively be tapped and/or routed to a set of input ports of select circuits of die region 211. Likewise, there is another set or portion of stitching lines that extend from die region 212 to another set of input ports of such select circuits of die region 211, which stitching lines may effectively be tapped and/or routed to another set of input ports of such select circuits of die region 212.

Die regions 211 and 212 may be tested at a wafer level, sometimes referred to as "wafer sort," where good and bad die regions may be identified for each wafer tested. However, die regions 211 and 212 may individually be quite complex and have many circuit elements. In other words, die regions 211 and 212 may individually draw a significant amount of power during testing. Unfortunately, there may be a limited amount of power available to be provided to a die region for wafer-level testing. For example, wafer sort testers may not be able to power-up all of a die 200.

Thus, to test a die 200, such die 200 may be modularly tested by testing die region 211 and then testing die region 212. As die region 212 may be powered down for wafer-level testing of die region 211, the amount of power provided to a wafer for such testing may be substantially reduced. Likewise, die region 211 may be powered down for wafer-level testing of die region 212. Such modular powering of die regions for testing a die 200 is not limited to wafer-level testing, but may be used after die 200 has been diced from a wafer 500. Accordingly, die 200 may be configured such that only signals pass across mask stitching region 210, as power is provided separately to each die region of die regions 211 and 212. Ground busing may pass across mask stitching region 210.

Again, even though only two die regions are illustratively depicted for purposes of clarity, more than two die regions may be used to form a die 200. Multiple die regions may be used to limit the amount of power to be used for testing each such die region. Additionally, as previously described, development, verification, and/or test time may be reduced by having modular die regions, as well as a reduction in database size, for forming a monolithic integrated circuit die device.

Multiplexers 511 are coupled to receive a select signal 512 for selection between a loopback mode for die region 211 and a stitch mode for die region 211. In a loopback mode for die region 211, signaling on input lines 516 is selected for output from multiplexers 511 responsive to select signal 512. In a stitch mode for die region 211, signaling from die region 212 on input lines 514 is selected for output from multiplexers 511 responsive to select signal 512. In other words, for a loopback mode for die region 211, signals on lines 516 input to multiplexers 511 are selected for output from such multiplexers 511, wherein such signals on lines 516 are effectively "looped back" into die region 211.

Likewise, multiplexers 521 are coupled to receive a select signal 522 for selection between a loopback mode for die region 212 and a stitch mode for die region 212. In a loopback mode for die region 212, signaling on input lines 526 is selected for output from multiplexers 521 responsive to select signal 522. In a stitch mode for die region 212, signaling from die region 211 on input lines 524 is selected for output from multiplexers 521 responsive to select signal 522. In other words, for a loopback mode for die region 212, signals on lines 526 input to multiplexers 521 are selected for output from such multiplexers 521, wherein such signals on lines 526 are effectively "looped back" into die region 212.

For example, if die region 211 fails during testing and die region 212 passes during testing, die 200 may be sold as a chip though with less functionality than had both die regions 211 and 212 passed. Along those lines, select signal 522 may be set, such as by fuse or other programming, to select a loopback mode for die region 212. Moreover, die region 211 may be set so as to disable it from being powered up, again such as by fuse or other programming. Thus, a "partials" strategy may be used. Along those lines, having more than two die regions may be used for greater granularity in such partials strategy; however, a master die region may be designated among such one or more passing die regions, such as described in additional detail in U.S. patent application Ser. No. 13/587,778 ("Flexible Sized Die for Use in Multi-Die Integrated Circuit" to Camarota, filed Aug. 16, 2012) and U.S. patent application Ser. No. 13/535,102 ("Oversized Interposer Formed from a Multi-Pattern Region Mask" to Camarota, filed Jun. 27, 2012), each of which is incorporated by reference herein in their entirety for all purposes. Designating a master die may be performed after modular testing. Selection of a master die may be predetermined; however, during testing any modular die may be temporarily made to appear to be a master, or a slave, for verification and test purposes, which may be useful so as to have a same verification and test procedure for each module.

Optionally, it may be that only a portion of die region 211 fails during testing, and such failed portion may be supplanted with a passing portion of die region 212. Thus, die region 212 may provide redundancy for die region 211. Along those lines, select signals 512 and 522 may each be set, such as by efuse, hard wire, or other programming, to select a stitch mode for their respective die regions. Even though FIG. 5 illustratively depicts global select signals for respective die regions, multiple sets of multiplexers and associated select signals may be used for each die region in order to provide greater granularity for supplanting a passing portion of one die region for a failing portion of another die region. Along those lines, for example, a portion of each of die regions 211 and 212 may fail, and redundant passing portions in each of die regions 211 and 212 may be used to supplant corresponding failing portions. In other words, there may be dual redundancy, as each die region may have redundancy for each other die region.

In the past, there may be one configuration controller and one test (e.g., JTAG tap) controller for a monolithic die, where all control and data signals for configuring and scanning crossed a mask-field boundary using stitched metal traces. However, for die regions 211 and 212, each such region may be the same, and so for example die region 211 and die region 212 may each have a configuration and test controller ("controller") block 571 and 572, respectively. Controller blocks 571 and 572 may each be respectively coupled to an input/output signal pair to and from multiplexers 511 and 521, respectively. For example, an output line 515 from a multiplexer 511 may be input to controller block 571, and an input line 516 may be output from controller block 571. Likewise, an output line 525 from a multiplexer 521 may be input to controller block 572, and an input line 526 may be output from controller block 571. All other lines 515, 516, 525, and 526 may extend to or from their associated region edge.

A die 200 with programmable termination blocks 517 and 527 respectively in die regions 211 and 212 may be used to allow each interconnect, including without limitation each clock input, to provide loop back within an associated die region or to connect to a signal from one die region to another die region on an opposite side of a stitching region of die 200. Along those lines, select signals 521 and 522 may propagate at least in part along a metal connection defined by mask layers, where such mask layers are different for different die regions, as described below in additional detail. Optionally, configuration blocks 281 and 282 of FIG. 2 may be used to drive select signals 521 and 522, respectively, in order to allow such signals to be dynamically controlled during test. Along those lines, such select signals 521 and 522 may be set at power up by efuse values in configuration blocks 281 and 282, respectively. Dynamic control of select signals 521 and 522 may provide flexibility in testing and/or defining a functional die.

By having "soft", as opposed to hard wired connected, select signals 521 and 522, both die regions 211 and 212 do not have to be powered up at the same time for testing during wafer sort. Furthermore, by having select signals 521 and 522 as soft signal states set in a configuration controller, such as for example configuration blocks 281 and 282, respectively, each die region 211 and 212 may be independently tested during wafer sort and/or partially functional die may be sold where a faulty die region in such die is bypassed in a chip package. In other words, select signals 521 and 522 may be used to isolate or disable a faulty die region from a passing die region. A manufacturer may set an efuse so as to prevent use of a faulty die region, and to set an associated select signal accordingly. Moreover, JTAG may be used for loopback for including or excluding registers in one die region from a scan chain in another die region. Along those lines, a circuit design may allow signals which go from one die region to another die region ("stitched signals") to have the possibility of electrically floating or being grounded to allow for an unused condition of a die region. Additionally, for wafer sort testing of a die region in isolation from other die regions, inputs to such die region under test may be to gates or to pass gates with floating wells, with appropriate outputs of such die region grounded, to prevent a die region under test from powering a die region not under test through a stitched interface. While ground may be connected between die regions, power signals may be sourced from bumps or pins respectively associated with die regions 211 and 212, where such bumps or pins are coupled to PDNs 271 and 272. Equalization of power may be performed using power planes of a package substrate holding die 200.

A portion of stitching or stitched lines 301 through 304 of a stitched interface may be redundant. Along those lines, an extra trace may be used for every some number of traces of such stitched interface.

Additionally, multiplexers 511 and 521 may include buffers or provide buffering of stitch signals. Along those lines, configuration and JTAG traces crossing a stitched interface may be buffered by controller blocks 571 and/or 572. While JTAG and/or configuration signals may not use loopback, such configuration and JTAG signals may be isolated responsive to die region of a die 200 but still allow for the possibility of interconnection across a stitched interface. For example, a JTAG scan chain may involve more than one die region of a die 200, and/or a master-slave association of die regions for configuration control may involve more than one die region of a die 200. Accordingly, multiplexers 511 and 521 as described herein may be used for such isolation as well as for such multi-die region interconnection.

With respect to interconnect line termination blocks 517 and 527, top and bottom termination cells of such blocks may be programmable. Each termination top may be at the edge of a "super-sized-monolithic" ("SSM") die 200 or a connection across a stitched boundary 210 to the bottom termination of the other half or portion of an SSM die. Each termination bottom can be at the edge of an SSM die or a connection across the stitched boundary to the top termination of the other half or portion of an SSM device. Control of each halves' or portion's top and bottom termination cell may come from an associated efuse in each of such halves' or portion's respective configuration block or from hard wired connections made using a metal layer in a half or portion thereof.

Having programmable terminations allows each die region, such as die regions 211 and 212 for example, of an SSM die 200 to be tested simultaneously by a multi-sight tester. Additionally, steppers used for wafer sort may have limitations in stepping range based on a die being less than maximum width and maximum length or height, such as for example 26×33 mm. In which instance, a wafer sort stepper may be used to independently test each die region, such as die regions 211 and 212 for example, of an SSM die 200. Thus, all die regions of an SSM die 200 need not be tested and powered at wafer sort at the same time, but rather die region modular testing may be used.

Figure 6:
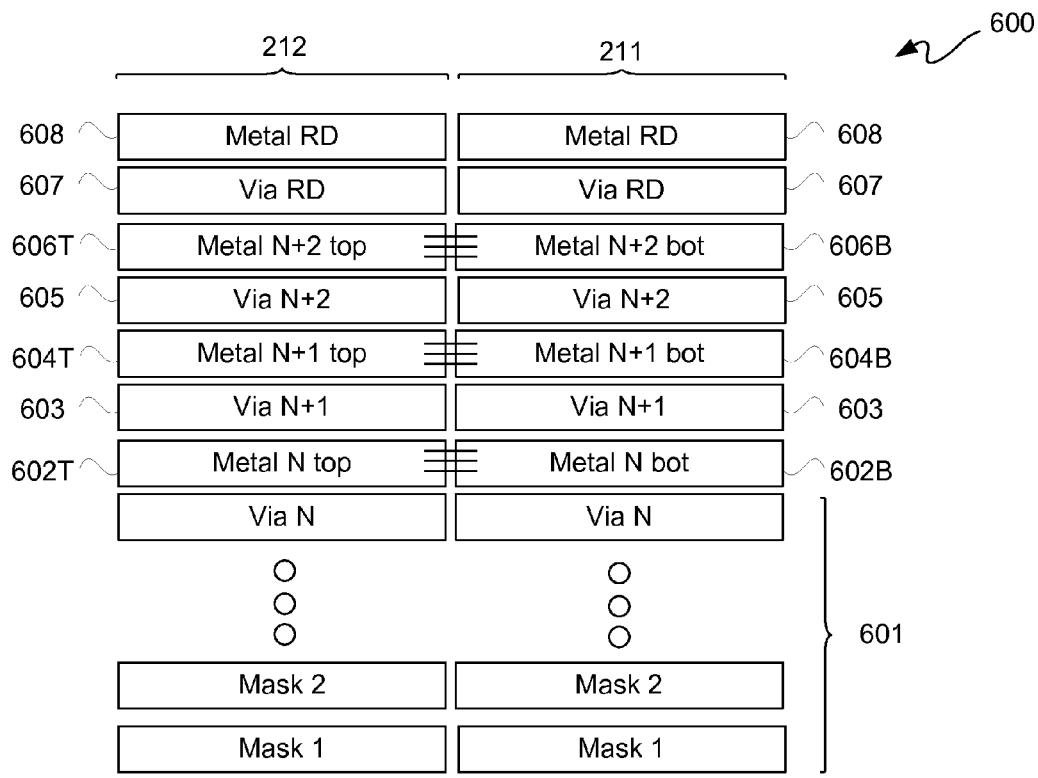
FIG. 6 is a block diagram depicting an exemplary layer stack, such as for die regions of FIG. 2 for example.

FIG. 6 is a block diagram depicting an exemplary layer stack 600, such as for die regions 211 and 212 for example. In this example, layers 601 up to and including an Nth via layer may be the same for both of die regions 211 and 212.

An Nth metal layer 602T for a top die region 212 may be different from an Nth metal layer 602B for a bottom die region 211, and such metal layers 602 may have stitched metal lines, as previously described, across a die region boundary, such as across mask stitching region 210. Likewise, N+1 and N+2 metal layers 604T and 606T for a top die region 212 may be different from corresponding N+1 and N+2 metal layers 604B and 606B for a bottom die region 211, and such metal layers 604 and 606 may each have stitched metal lines. Corresponding intervening N+1 and N+2 via layers 603 and 605 may be the same for both die regions 211 and 212. Moreover, via redistribution ("RD") layer 607 and metal RD layer 608 may be the same for both die regions 211 and 212. As there are no vias in a stitched region, via masks, even for stitched layers, may be the same for die regions 211 and 212. Moreover, by having a same RD layer 608, namely by having a same bump definition layer, as between die regions, modular testing of each die region with a same or same configuration of a wafer sort probe card may be used.

Having stitched metal layers at the highest metal layers in a stack may be useful, because: (1) higher layer masks may be less expensive to duplicate; (2) higher layers may have more relaxed process integration, design, routing, and/or placement rules which may be more compatible with stitching; (3) higher layers may leave open an option for performing stitching in a different manufacturing facility than used for processing of lower layers; and/or (4) higher layers may have increased ability to visually inspect stitching for initial process development.

Accordingly, an SSM die 200 does not have twice the number of masks as only some stitching layers may be different between die regions. Furthermore, process complexity of switching masks, such as for double patterning lower metal layers, may be avoided. Even though each die region of an SSM die 200 is modular, die regions of an SSM die 200 may be interconnected and function so as to appear as a single device, including without limitation for purposes of a master-slave configuration and a JTAG scan chain. By subdividing SSM die 200 into manageably sized die regions, range of steps of wafer sort steppers may be within the operating parameters thereof even though overall size of SSM die 200 exceeds a step size of such wafer sort steppers. Moreover, by subdividing into die regions, power, memory, and/or probe point demands during wafer level testing are more manageable. The ability to isolate each die region or section allows for construction of a software-derived die ("SDD") or partially functional die ("partial").

Figure 7:
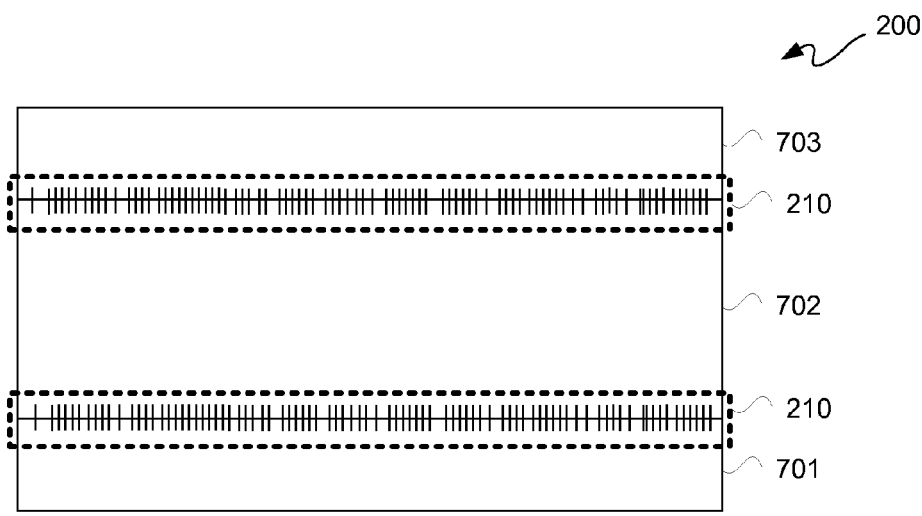
FIG. 7 is a bock diagram depicting an exemplary die of FIG. 2 with three die regions of different sizes.

Again, even though only two die regions of equal size were described, the above description is not so limited. Along those lines, FIG. 7 is a bock diagram depicting an exemplary die 200 with three die regions 701-703 of different sizes. In FIG. 7, die 200 has a mask stitching region 210 for interconnecting die regions 701 and 702 to one another, and another mask stitching region 210 for interconnecting die regions 702 and 703. Die regions 701 through 703 may be modularly interconnected or isolated using select circuits and input and output lines, such as previously described with reference to FIG. 5. In this example, die regions 701 and 703 are the same size, but die region 702 is larger than either die region 701 or 703.

Figure 8:
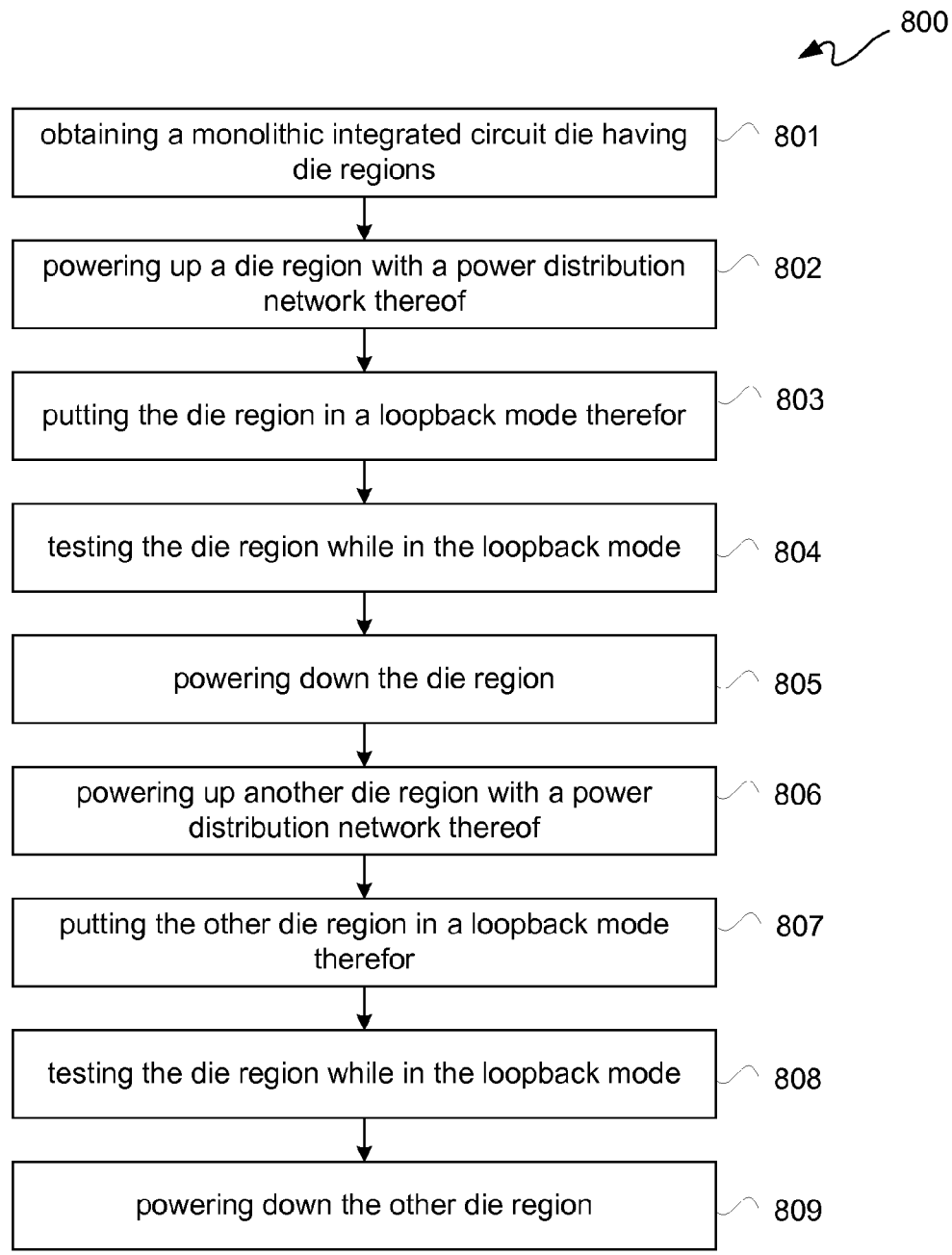
FIG. 8 is a flow diagram depicting an exemplary wafer-level test flow.

FIG. 8 is a flow diagram depicting an exemplary wafer-level test flow 800. FIG. 8 is further described with simultaneous reference to FIGS. 2, 3, 5, and 8.

At 801, a die 200 having two or more die regions, such as for example a die region 211 and a die region 212, is obtained. Again, die regions have separate PDNs for independently operating such die regions. At 802, die region 211 may be powered up with a PDN 271, while leaving PDN 272 of die region 212 powered down. At 803, die region 211 may be put in a loopback mode responsive to assertion of select signal 512. At 804, die region 211 may be tested while in such a loopback mode.

At 805, die region 211 may be powered down. At 806, die region 212 may be powered up with a PDN 272. At 807, die region 212 may be put in a loopback mode responsive to assertion of select signal 522. At 808, die region 212 may be tested while in such a loopback mode. At 809, die region 212 may be powered down.

Testing at 804 and 808 may both performed at a wafer level. However, once a die 200 is separated from a wafer 500, die 200 may be tested as a whole die with both of regions powered up and with select signals 512 and 522 asserted to allowing stitching of signals between die regions 211 and 212.

Figure 9:
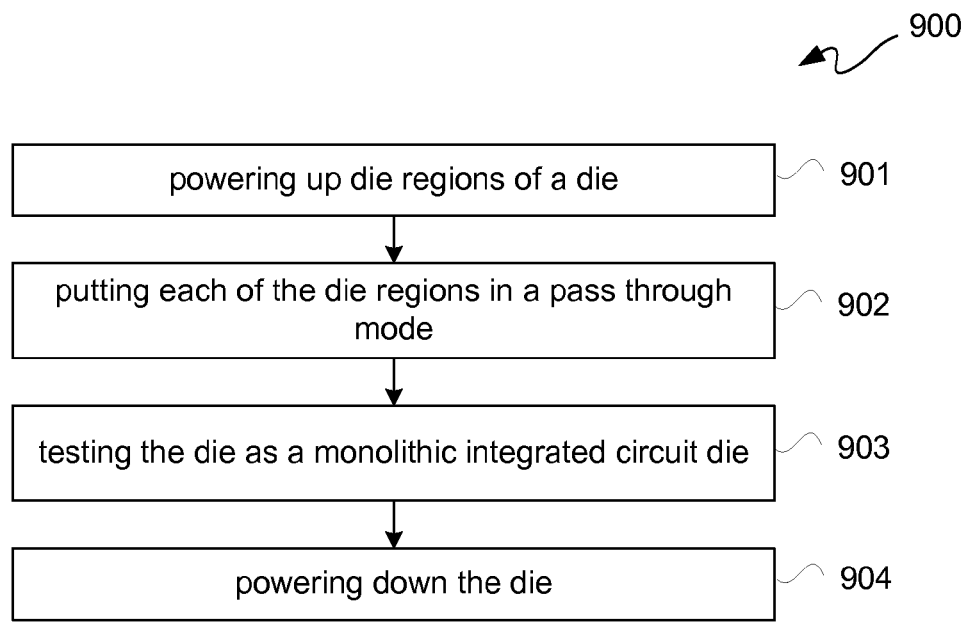
FIG. 9 is a flow diagram depicting an exemplary chip-level test flow.

FIG. 9 is a flow diagram depicting an exemplary chip-level test flow 900. Chip-level test flow 900 may be performed after wafer-level test flow 800, such as being part of an overall test flow. FIG. 9 is further described with simultaneous reference to FIGS. 2, 3, 5, and 9.

At 901, die regions of a die, such as die regions 211 and 212 of die 200 for example, are powered up. At 902, each of die regions 211 and 212 is put in a stitch mode. At 903, die 200 may be tested as a whole, namely tested as a monolithic integrated circuit die, at a chip level. At 904, die 200 may be powered down.

Accordingly a monolithic integrated circuit die has been described, where such die is formed of modular dies or die regions. As described above, this modularity of design may facilitate power management during testing. Furthermore, the depth of test vectors may be reduced, which may save testing time and storage space, as each die region may be independently tested. Additionally, verification time for a design may be reduced with reduced complexity afforded by a modular design, namely simulation time and other complications associated with management of a large design may be reduced by being able to verify individual modules at a time rather than having to verify an entire large monolithic integrated circuit die at the same time. Furthermore, the amount of mask definition data may be reduced by use of die regions, as one set of mask definition data for a die region may be repeated for multiple die regions apart from differences in stitching layers. Quality and reliability may likewise be enhanced by use of die regions, as larger more complex designs are more susceptible to unverified or untested regions and modes resulting in latent failures. In contrast, modular die regions have a more manageable size for being more thoroughly verified and tested than non-modular large complex integrated circuit designs. Last, for PLDs, modular die regions may be more suitable for characterization models used by PLD design tools.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An apparatus comprising:
   a monolithic integrated circuit die having a plurality of modular die regions;
   wherein the modular die regions respectively have a plurality of power distribution networks for independently powering each of the modular die regions;
   wherein each adjacent pair of the modular die regions is stitched together with a respective plurality of metal lines, wherein each metal line of the plurality of metal lines continuously extends between and serially couples the adjacent pair of the modular die regions;
   wherein the plurality of modular die regions includes a first die region and a second die region;
   wherein the first die region includes first select circuits coupled to a first programmable termination block to receive a first select signal;
   wherein the first select circuits are first multiplexers of the first die region;
   wherein the second die region includes second select circuits coupled to a second programmable termination block to receive a second select signal; and
   wherein the second select circuits are second multiplexers of the second die region.

2. The apparatus according to claim 1, wherein:
   the first die region has a first power distribution network of the plurality of power distribution networks;
   the second die region has a second power distribution network of the plurality of power distribution networks;
   the first power distribution network is separate from the second power distribution network for operation of the first die region independently from the second die region; and
   the first die region and the second die region are interconnected to one another through the plurality of metal lines.

3. The apparatus according to claim 1, wherein:
   the monolithic integrated circuit die has an overall length which is a combination of a length of the first die region and a length of the second die region; and
   the overall length exceeds a maximum imaging dimension for a lithographic operation.

4. The apparatus according to claim 3, wherein a die seal of the monolithic integrated circuit die comprises:
   a first wall formed in the first die region; and
   a second wall formed in the second die region;
   wherein the first wall and the second wall face one another and are connected to one another to provide the die seal of the monolithic integrated circuit die.

5. The apparatus according to claim 2, wherein:
   a first portion of the plurality of metal lines extend from the first die region to first input ports of the second select circuits of the second die region; and
   a second portion of the plurality of metal lines extend within the second die region to second input ports of the second select circuits of the second die region.

6. The apparatus according to claim 5, wherein:
   a third portion of the plurality of metal lines extend from the second die region to first input ports of the first select circuits of the first die region; and
   a fourth portion of the plurality of metal lines extend within the first die region to second input ports of the first select circuits of the first die region.

7. The apparatus according to claim 1, wherein:
   the first multiplexers are coupled to receive the first select signal for selection between a first loopback mode and a first stitch mode for the first die region; and
   the second multiplexers are coupled to receive the second select signal for selection between a second loopback mode and a second stitch mode for the second die region.

8. The apparatus according to claim 6, wherein the first portion and the third portion of the plurality of metal lines extend through a mask stitching region between the first die region and the second die region.

9. The apparatus according to claim 1, wherein the first programmable termination block and the second programmable termination block are respectively provided with a first configuration block of the first die region and a second configuration block of the second die region.

10. An apparatus comprising:
    a monolithic integrated circuit die having a plurality of modular die regions;
    wherein the modular die regions respectively have a plurality of power distribution networks for independently powering each of the modular die regions;
    wherein each adjacent pair of the modular die regions is stitched together with a respective plurality of metal lines, wherein each metal line of the plurality of metal lines continuously extends between and serially couples the adjacent pair of the modular die regions;
    wherein the plurality of modular die regions includes a first die region and a second die region;
    wherein the first die region includes first select circuits coupled to a first programmable termination block to receive a first select signal;
    wherein the first select circuits are first multiplexers of the first die region;
    wherein the second die region includes second select circuits coupled to a second programmable termination block to receive a second select signal;
    wherein the second select circuits are second multiplexers of the second die region;
    wherein a first portion of the plurality of metal lines extend from the first die region to first input ports of the second select circuits of the second die region; and
    wherein a second portion of the plurality of metal lines extend within the second die region to second input ports of the second select circuits of the second die region.

11. The apparatus according to claim 10, wherein:
    a third portion of the plurality of metal lines extend from the second die region to first input ports of the first select circuits of the first die region; and
    a fourth portion of the plurality of metal lines extend within the first die region to second input ports of the first select circuits of the first die region.

12. The apparatus according to claim 10, wherein:
    the first multiplexers are coupled to receive the first select signal for selection between a first loopback mode and a first stitch mode for the first die region; and
    the second multiplexers are coupled to receive the second select signal for selection between a second loopback mode and a second stitch mode for the second die region.

13. The apparatus according to claim 11, wherein the first portion and the third portion of the plurality of metal lines extend through a mask stitching region between the first die region and the second die region.

14. The apparatus according to claim 10, wherein the first programmable termination block and the second programmable termination block are respectively provided with a first configuration block of the first die region and a second configuration block of the second die region.

15. The apparatus according to claim 10, wherein the first select signal is sourced from the first programmable termination block and wherein the second select signal is sourced from the second programmable termination block.

* * * * *